United States Patent [19]
Momose et al.

[11] 3,984,186
[45] Oct. 5, 1976

[54] PROJECTION MASKING SYSTEM

[75] Inventors: Katsumi Momose, Yokohama; Yu Yamada, Kodaira; Hideki Yoshinari, Tokyo, all of Japan

[73] Assignee: Canon Kabushiki Kaisha, Tokyo, Japan

[22] Filed: July 30, 1973

[21] Appl. No.: 384,022

Related U.S. Application Data

[63] Continuation-in-part of Ser. No. 313,671, Dec. 11, 1972, abandoned, which is a continuation-in-part of Ser. No. 184,893, Sept. 29, 1971, abandoned, which is a continuation of Ser. No. 14,597, Feb. 26, 1970, abandoned.

[30] Foreign Application Priority Data

| Feb. 27, 1969 | Japan | 44-17480 |
| Feb. 27, 1969 | Japan | 44-17481 |
| Dec. 11, 1969 | Japan | 44-99699 |
| Feb. 12, 1970 | Japan | 45-12202 |
| Feb. 20, 1970 | Japan | 45-15124 |

[52] U.S. Cl. ................................. 355/45; 354/79
[51] Int. Cl.² .................................. G03B 27/32
[58] Field of Search ............. 355/45, 44, 43, 52, 355/53, 54, 18; 354/79

[56] References Cited
UNITED STATES PATENTS

| 3,012,465 | 12/1961 | Goldberg | 355/45 X |
| 3,205,767 | 9/1965 | Weber et al. | 355/71 X |
| 3,498,705 | 3/1970 | Ooue et al. | 355/71 X |
| 3,584,949 | 6/1971 | Clow | 355/45 |
| 3,610,750 | 10/1971 | Lewis | 355/54 X |
| 3,617,125 | 11/1971 | Sobottke | 355/53 X |

*Primary Examiner*—Joseph F. Peters, Jr.
*Assistant Examiner*—E. M. O'Connor
*Attorney, Agent, or Firm*—Toren, McGeady and Stanger

[57] ABSTRACT

In the system disclosed, illuminating means form an optical path. An imaging system in the optical path includes a support for a mask, an imaging lens that focuses the image of the mask onto an optical plane, and a support that holds a component having a radiation-sensitive surface at the plane. A filter in the illuminating system blocks out light capable of affecting the radiation-sensitive material but allows passage of some visible light so that the image of the mask can be seen on the component. A half-mirror or beam splitter allows light from the imaging lens to focus on the component but deflects a portion of the light coming from the component toward an analyzer that detects the alignment between the image of the mask and the component. A second half-mirror or beam splitter near the first half-mirror compensates for radial shift of the image relative to the axis of the light path caused by the first half-mirror. The analyzer as well as the half-mirrors and the filter may be removed simultaneously after alignment to allow projection masking.

17 Claims, 27 Drawing Figures

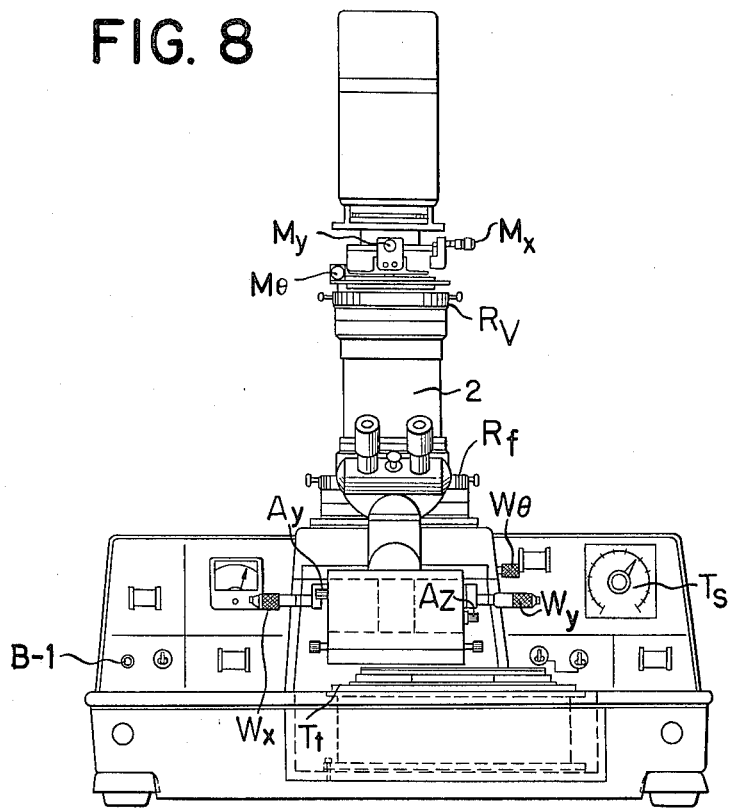
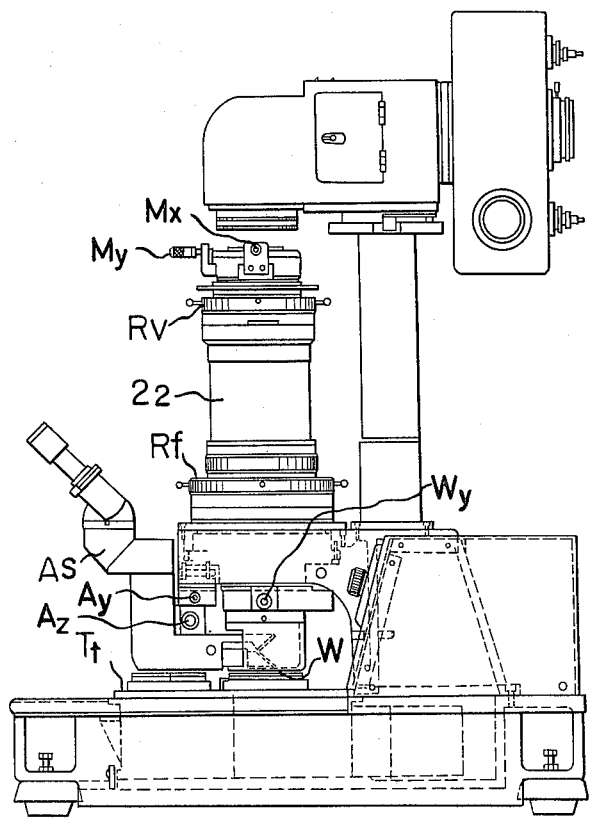

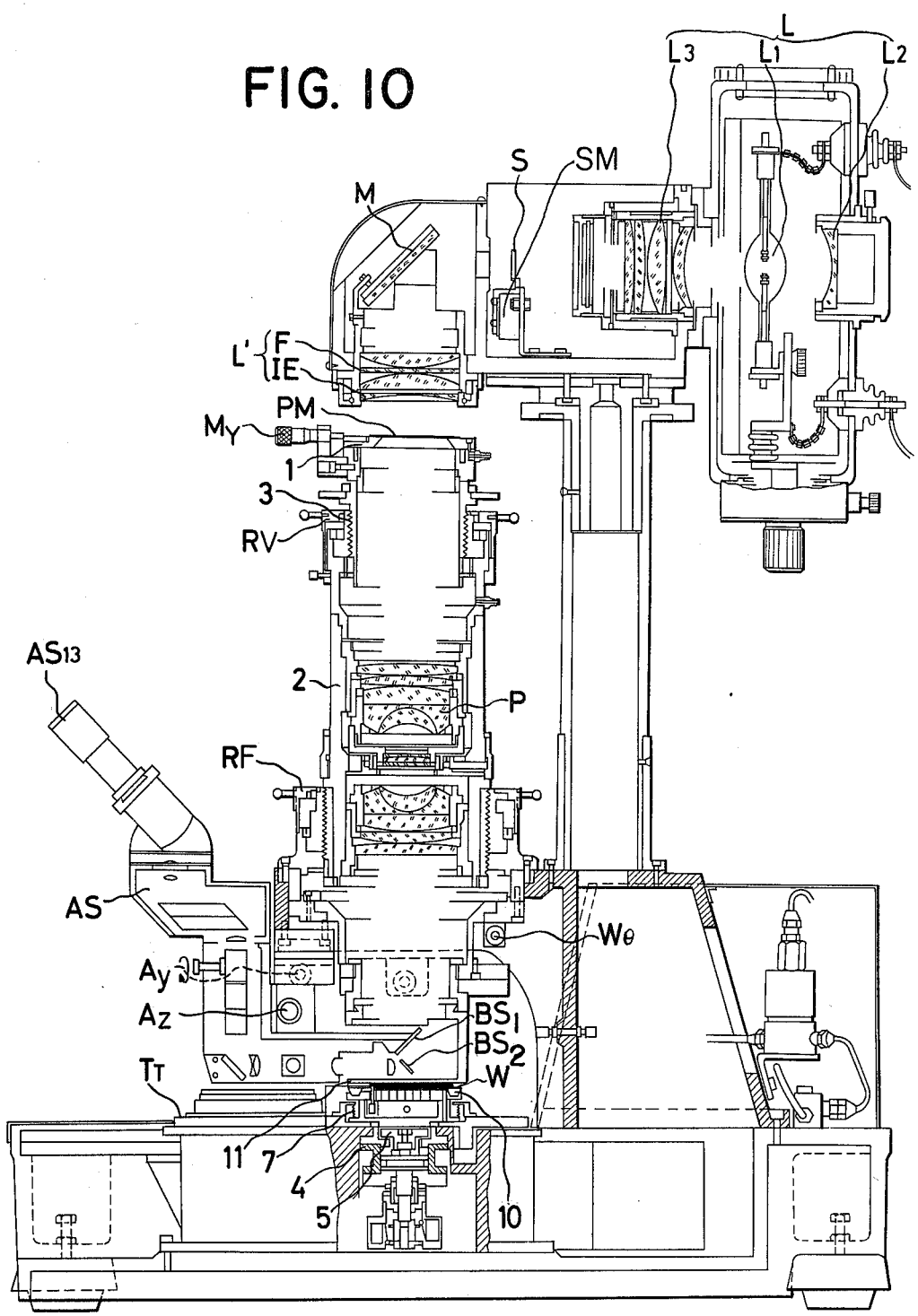

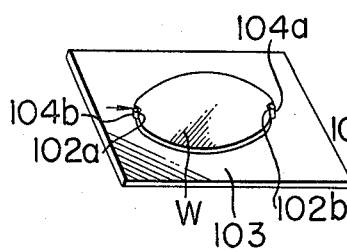
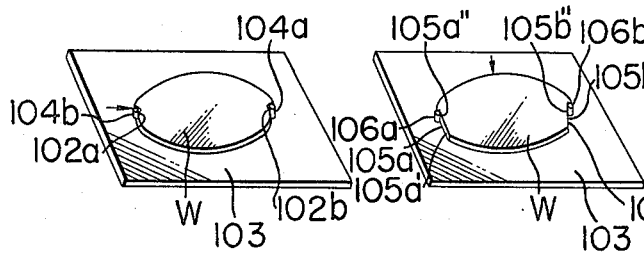
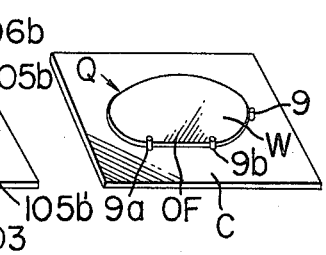
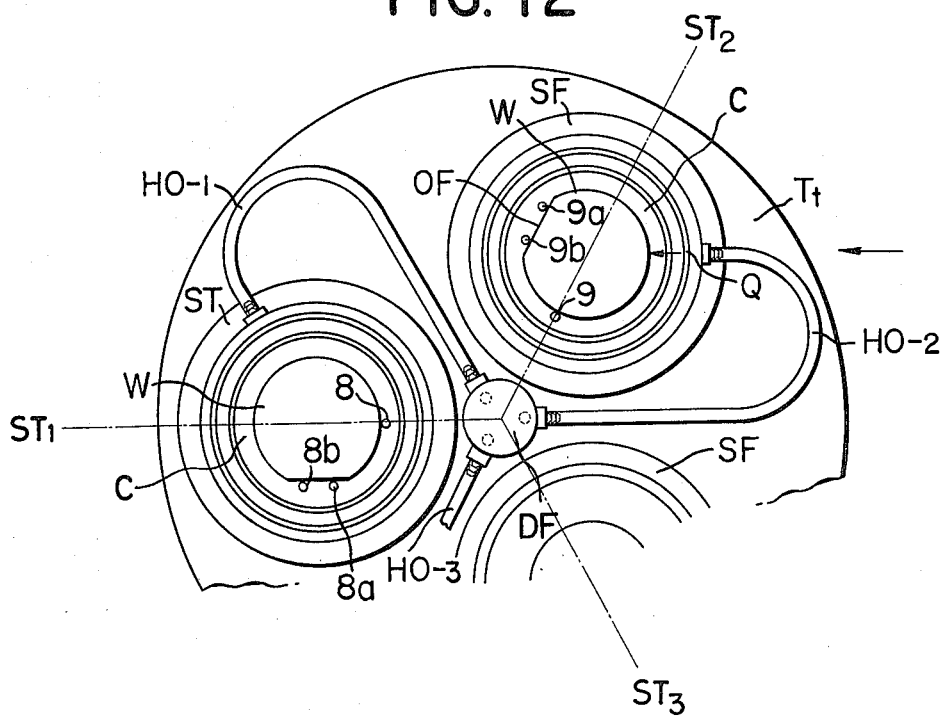

FIG. 16
FIG. 17
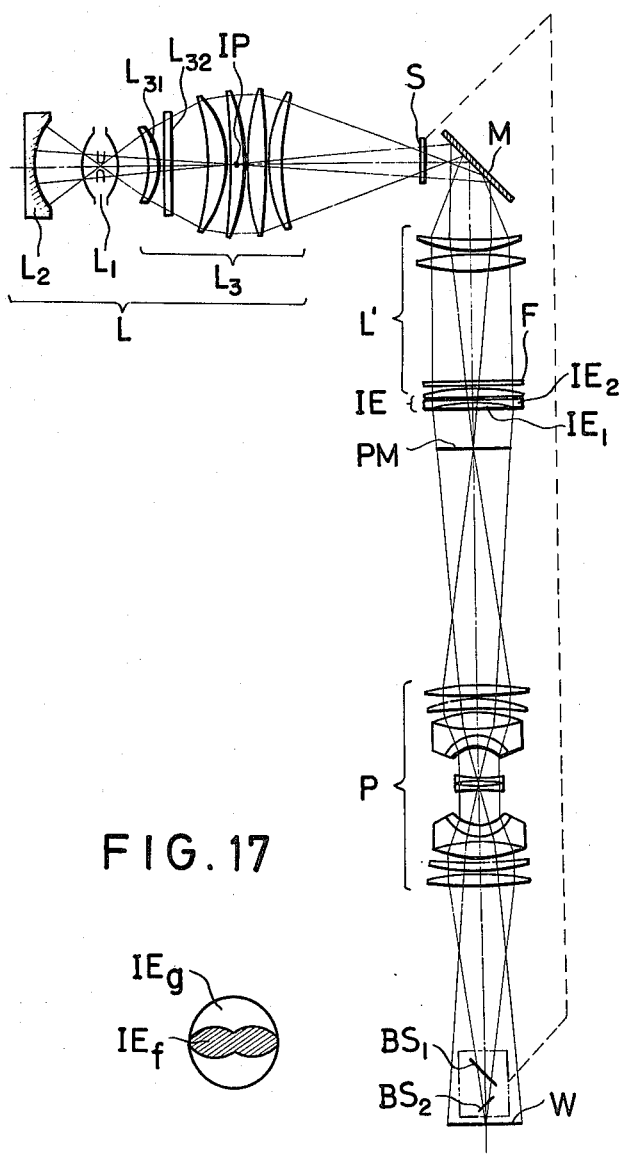
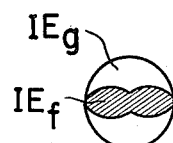

PROJECTION MASKING SYSTEM

REFERENCE TO CO-PENDING APPLICATIONS

This is a continuation-in-part of application Ser. No. 313,671 filed Dec. 11, 1972, which in turn is a continuation-in-part of application Ser. No. 184,893 filed Sept. 29, 1971 for PROJECTION MASKING SYSTEM. The latter application was a continuation of Ser. No. 14,597 filed Feb. 26, 1970. All of the above mentioned applications are now abandoned.

BACKGROUND OF THE INVENTION

This invention relates to image masking systems, particularly for manufacturing semiconductor components, such as integrated circuits and transistors.

Generally, in the manufacture of such components several kinds of photo-masks having precise images are printed on a component which is made photo-sensitive by coating photo-resist on a base such as silicon. The component may then be etched to the shape of the image. In a widely used system, face-to-face printing is accomplished by having the photo-mask and the photo-sensitive material contact each other and exposing the material to light. Such contact is likely to scratch the photomask and result in its deterioration. The photo-sensitive material is also likely to be scratched. As a result, the ratio of defective products is comparatively high.

An object of the present invention is to improve masking systems.

Another object of the invention is to eliminate these defects.

SUMMARY OF THE INVENTION

According to a feature of the invention, these objects are obtained in whole or in part by projecting the image of the component to be etched through a mask spaced from the photo-sensitive material.

According to another feature of the invention, a single illuminating optical system serves both for projection masking and for determining the alignment between the image and the photo-sensitive material on the component. An imaging system includes a mask support, an imaging lens and a radiation-sensitive material support. The illuminating optical system and the imaging system are aligned along a light path. Switching means in the illuminating optical system switch from a projection masking mode to an alignment detection mode or vice versa. Beam splitting means allow the position of the image and the component to be compared. Compensating means compensate for the effect of the beam splitter upon the portion of the beam passing to the photo-sensitive material on the component.

According to a more general aspect of the invention, the projection masking system includes an illuminating optical system for alignment detection, an imaging system that comprises a mask support and an imaging lens as well as a radiation-sensitive material support, a pair of beam-splitting means on the side of the radiation-sensitive material support for alignment detection, and compensating means for compensating the shift of the beam caused by the beam-splitting means.

According to another feature of the invention, the illuminating optical system serves for projection masking and alignment detection. First and second condensing optical systems interact so that a first image of the illuminating source is focused at a position between the first and second condensing optical systems and a second image of the illuminating source is focused within the imaging lens. An imaginary point of the conjugate relationship of a mask on the mask support to the second condensing optical system is placed between the illuminating source and the first image.

These and other features of the invention are pointed out in the claims. Other objects and advantages of the invention will become evident in the following detailed description when read in light of the accompanying drawings.

BRIEF DESCRIPTION OF THE DRAWINGS

In the drawings:

FIGS. 8, 9, and 10 are front elevations and side elevations and a cross-sectional side elevation of the projection masking system in FIG. 1 also embodying features of the invention.

FIG. 11, 11a and 11b are schematic drawings showing positioning means for positioning wafers with radiation-sensitive material in the projection masking system of FIGS. 1 and 8.

FIG. 12 is a plan view of a mask support having a loading stage, an exposure stage, and an unloading stage, and forms a part of the apparatuses in FIGS. 1 and 8.

FIGS. 15 and 15a are plan and cross-sectional views of another precision-adjusting mechanism similar to that in FIGS. 14 and 14a.

FIG. 16 is a schematic arrangement illustrating another projection masking system embodying features of the invention.

FIG. 17 illustrates an illumination equalizer suitable for use in embodiments of the present invention and embodying features of the present invention.

DESCRIPTION OF PREFERRED EMBODIMENTS

Figure 1:
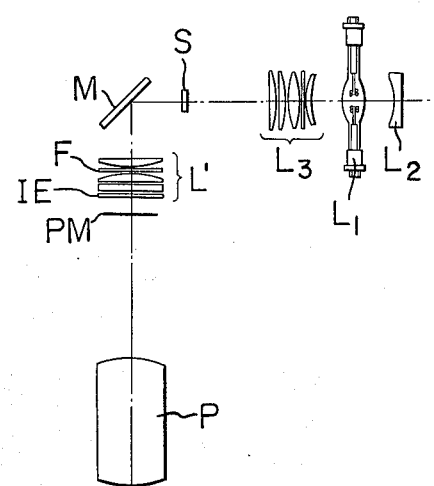
FIG. 1 is a schematic diagram illustrating the arrangement of a projection masking system embodying features of the invention.

In FIG. 1, the image of the pattern of a mask PM is focused on a wafer W having at least a top surface of radiation-sensitive material. To permit alignment of the wafer W wth the focused image, a filter S in the light path transmits only light frequencies such as 546 πm to which the material is insensitive. At the same time beam splitters or half-mirrors $BS_2$ and $BS_{2'}$ which permit light to reach the wafer W, deflect light returning from the surface of the wafer to an optical system AS that detects the alignment between the mask image and the wafer W. When the alignment is correct, the beam splitters $BS_2$ and $BS_{2'}$ as well as suitable portions of system AS and compensating beam splitter $BS_1$ are removed from the light path. A switching mechanism SM simultaneously moves filter S from the light path. The beam splitter $BS_1$ compensates for any shift imparted to the light by the beam splitters $BS_2$ and $BS_{2'}$.

Projection masking now proceeds. Light to which the radiation-sensitive material responds is focused on the wafer. The system L directs light toward the left. A reflecting mirror M reflects light that has been reflected and refracted toward the mirror by the system $L_3$ and the condenser $L_2$, toward a second optical condensing system L'. Before reaching the mirror M, the light passes through the switching apparatus S in the form of a sharp cut filter that functions as an exposure shutter.

The system L' incorporates a sharp cut filter F and an illumination equalizer IE. The system L' directs the light through a high resolving power imaging lens P whose focal distance is 17mm and whose F-number is 1.8. The projection mask PM is located at the object plane.

Figure 1B:
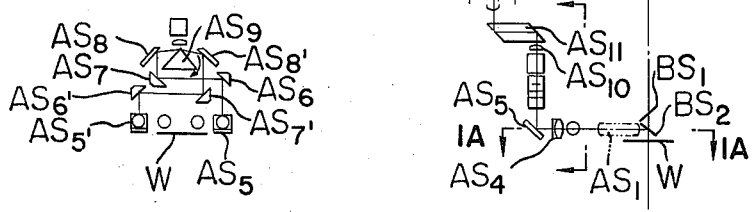
FIG. 1A and 1B are schematic illustrations of section 1A—1A and 1B—1B of FIG. 1.
Figure 1A:
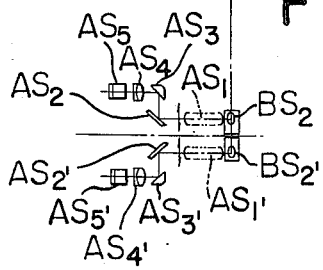

The imaging lens P directs the light containing the image of the projection mask toward the wafer W of radiation-sensitive material at the image plane of the lens P. Before reaching the wafer W, the light passes partially, through compensating means $BS_1$ and a pair of beam splitters $BS_2$ and $BS_{2'}$ which appear at the image side. The beam splitters $BS_2$ and $BS_{2'}$ are arranged side-by-side as shown in FIG. 1A.

The filter F passes the same frequencies as the filter S but also transmits light capable of exciting the radiation-sensitive material of the wafer W.

After the light has passed through the beam splitters $BS_1$, $BS_2$, and $BS_{2'}$, it strikes the wafer W. The image reflected by the wafer W is in turn reflected to the left (in FIGS. 1 and 1A) by the beam splitters $BS_2$ and $BS_{2'}$.

An optical system AS in the form of a binocular microscope serves for alignment detection. Details of the optical system AS are shown in FIGS. 1A and 1B. Here, in the systems AS, lens groups $AS_1$ and $AS_{1'}$ direct the light from the beam splitters $BS_2$ and $BS_{2'}$ toward reflection mirrors $AS_2$ and $AS_{2'}$. Prisms $AS_3$ and $AS_{3'}$ in turn direct light from the mirrors $AS_2$ and $AS_{2'}$ through another lens group $AS_4$ and $AS_{4'}$. Other reflective mirrors $AS_5$ and $AS_{5'}$ direct the resulting beams toward prisms $AS_6$ and $AS_{6'}$ as shown in FIG. 1B. The beams leaving the latter prisms are directed in opposite directions and are in turn deflected by prisms $AS_7$ and $AS_{7'}$ towards mirrors $AS_8$ and $AS_{8'}$ which correspond to the beam splitters $BS_2$ and $BS_{2'}$. Ultimately, the beams which pass through the beam splitters $BS_2$ and $BS_{2'}$ and which emerge from the mirrors $AS_8$ and $AS_{8'}$ arrive at a rotatable field splitter $AS_9$ of triangular cross section. Effectively, the separate prisms and mirrors form respective optical paths from the beam splitters $BS_2$ and $BS_{2'}$ to the field splitter $AS_9$ in the binocular alignment microscope AS.

In one embodiment, the beam splitters are in the form of half-mirrors. The light reflected by the beam splitter $BS_1$ is, according to an embodiment of the invention, introduced to light measuring means for light measurement and printing exposure control.

As shown in FIG. 1, the beams from the field splitter $AS_9$ pass through lens $AS_{10}$, prism $AS_{11}$, and lens $AS_{12}$ to an alignment detection window $AS_{13}$. The rotatable field splitter $AS_9$ is rotatable around the inner center for a total field view. The field splitter in the position shown in FIG. 1B displays each half field of the beams from the beam splitters $BS_2$ and $BS_{2'}$. When the field splitter is rotated from the position shown, the field splitter displays virtually the total field of the beam from one of the beam splitters $BS_2$ and $BS_{2'}$.

According to the embodiment shown, the beam splitters $BS_1$ and $BS_{2'}$ are provided at two locations corresponding to the locations of the lens groups $AS_1$ and $AS_{1'}$. However, they need not necessarily be separately provided at two locations. According to another embodiment of the invention a single beam splitter is used.

As previously stated, the pattern of the mask DM is focused on a wafer W of radiation-sensitive material. The relative position of the pattern on the mask PM and the radiation-sensitive wafer W is detected by the optical system AS to determine the accuracy of the alignment. A precision-adjusting mechanism then adjusts the alignment and the illuminating beam is switched to a projection masking mode so that the pattern of the mask PM is exposed on the wafer W with the radiation-sensitive material.

Figure 2:
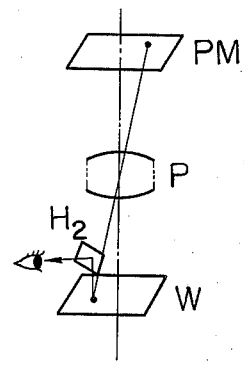
FIGS. 2 to 7 are schematic representations illustrating the operation of various portions of the embodiment in FIGS. 1, 1A and 1B.

The purpose of the compensating means $BS_1$ can best be understood by referring to FIGS. 2, 3, 4, and 5. In general, in order to observe the relative positions of the images of the mask PM and the radiation-sensitive material on the wafer W through the optical alignment detection system, a portion of the beam focused on the wafer W through the lens P must be directed to an observation window as shown in FIG. 2. If this is done with a small mirror as shown in FIG. 2, only a portion of the focused beam can be observed. The exact distribution of the amount of light is not observable. Also, the beam is vignetted by the observation lens and the mirror $H_2$. This causes darkening of a portion of the field of the image. Moreover, because the image is observed within an oblique beam, the image within the field of view is partially defocused.

Figure 3:
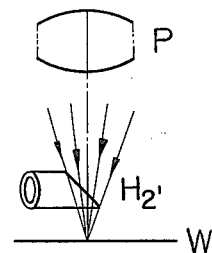

To eliminate these shortcomings, the wafer W could be observed through a half-mirrored component $H_{2'}$ located between the lens P and the wafer W of radiation-sensitive material as shown in FIG. 3. In this case a part of the full diameter of the focused beam is directed to the observation window. Thus, an exact image is observed. In addition, no partial darkening and defocusing of the field of view results.

Figure 4:
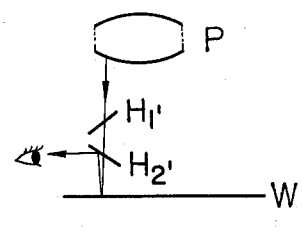

However, insertion of a half-mirrored component in the focused beam may cause shifting and aberration of the image. To overcome this problem the thickness of the half-mirrored component $H_2'$ is made as thin as possible. Moreover, compensating means $H_1'$ are added as shown in FIG. 4 to compensate for the shifting of the image. This compensating means $H_1'$ corresponds to the compensating means $BS_1$ in FIG. 1 which serves the same purpose.

Figure 5:
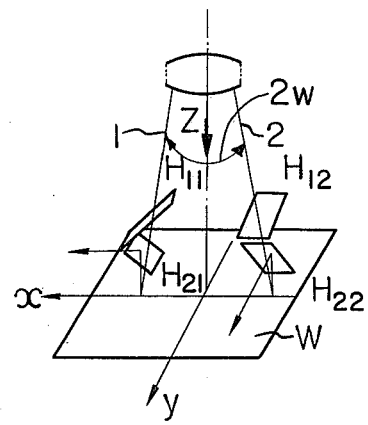

The arrangement of the shift compensating means $BS_1$ relative to the beam splitting means $BS_2$ may be achieved in one of the following ways. The angle between the lower surface of the beam splitting means and the plane including the optical axis is substantially equal to an angle between the upper surface of the compensating means and that plane. Two examples of this are shown in FIG. 5. Here a compensating light $H_{11}$ passes a beam 1 through a beam splitter $H_{21}$ which focuses the beam along the $x$ axis. For convenience, this is identified as case number 1. In case number 2, compensating means $H_{12}$ and beam splitter $H_{22}$ deflect the beam 2 along the $y$ axis. In both cases, the beam splitting means $H_{21}$ and $H_{22}$ form an angle of 45° with the surface of the wafer W of radiation-sensitive material. A shift compensating means $H_{11}$ and $H_{12}$ form angles of 90° with the beam splitters or beam splitting means $H_{21}$ and $H_{22}$. All the thicknesses are identical. The beam splitters $H_{21}$ and $H_{22}$ and the compensators or compensating means $H_{11}$ and $H_{12}$ are formed from pellicle mirrors. With measurements made with an angle of vision $2\omega$ of 8°47' the measured results of the shift of the imaging point along the $x$, $y$, and $z$ axes for cases 1 and 2 in FIG. 5 appear in Table 1. In that Table the results are shown for pellicle mirrors 25 microns thick and pellicle mirrors 12.5 microns thick. ($\mu$ = microns.)

Table 1

| Thickness of pellicle mirror ($\mu$) | Coordinates | Case 1 ($\mu$) | Case 2 ($\mu$) |
|---|---|---|---|
| 25 | x | −2.3 | +1.2 |
|  | y | 0 | 0 |
|  | z | −18 | −16 |
| 12.5 | x | −1.2 | +0.62 |
|  | y | 0 | 0 |
|  | z | −8.3 | −8.2 |

Table 1 illustrates that the shift of the imaging point in the $x$-direction is very small for case 2.

For mask projection, the beam splitting means and the shift compensating means are removed from the optical paths. A shorter wavelength beam is used for illumination during mask projection than for alignment detection during which a beam of comparatively long wavelength is used. The image of the mask PM, formed by the imaging lens P lies in a plane which deviates slightly, in an upward direction, in the plane of the wafer W. This is a minus $z$-direction. The deviation is offset by the elongation of the length of the optical path which occurs when the beam splitting means and the shift compensating means are used.

An offsetting means enables mask projection printing with a long wavelength beam and detection with a short wavelength. The projection optical system or imaging lens P is modified for such offsetting.

Figure 6:
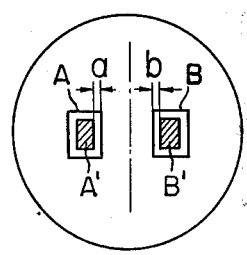
Figure 7:
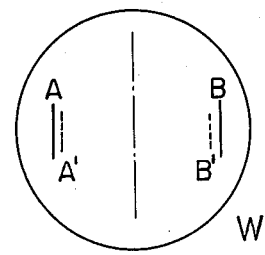

Thus, as shown in FIGS. 6 and 7, projected images A' and B' of marks on the mask and alignment marks A and B on the surface of the radiation-sensitive material make the alignment quite easy. That is, alignment marks A and B and the projected images A' and B' are positioned to be substantially symmetrical to the optical axis. When the radiation-sensitive material on the wafer W is not aligned with the mask PM, a difference appears between the dimensions $a$ and $b$ in FIG. 6 through the alignment detection window $AS_{13}$ of the optical system AS. Therefore, proper alignment may be obtained by adjusting the system to eliminate the difference.

According to the present invention, the compensating means $BS_1$ and $BS_1'$ compensate for the shift of the imaging point through the beam splitters $BS_2$ and $BS_2'$. Because the arrangement is symmetrical to the optical axis, the remaining shift does not affect alignment or produce alignment error.

FIG. 7 is a schematic drawing illustrating the relation between marks A and B on the radiation-sensitive material and the projected images A' and B' when a field of view as shown in FIG. 6 is observed in the optical system AS. The projected images A' and B' may be positioned so as to produce no harmful effect to a product even after exposure. The marks A and B correspond to the images A' and B' and may be provided on the radiation-sensitive material beforehand.

It is possible to measure the quality of the beam or to control the exposure time by receiving beams reflecting from the compensating means.

FIGS. 8, 9, and 10 are respectively, a front elevation, a side elevation, and a cross-sectional side elevation of the projection masking system embodying features of the invention.

As is apparent from the drawings, because the system is of the vertical type, the mask in radiation-sensitive material may be easily secured in a horizontal position. The image magnification factor of the imaging lens may be made precisely constant with a simplified focus adjusting mechanism.

In FIGS. 8, 9, and 10. the relative spacing between the lens P, the mask PM and the radiation-sensitive material can be easily adjusted to a deviation of 1 micron or less. The angular relation of the mask PM and the radiation-sensitive material W to the optical axis can be controlled to within 0° 12' or less. That is, the relative angular deviation of the mask surface from the surface of the radiation-sensitive material due to the slack of a helicoid portion can be almost neglected Thus, a high degree of accuracy may be secured. Except for alignment detection, no half mirrors or similar devices are used in the imaging optical system for mask projection printing other than the imaging lens P. Therefore, the quality of the image will be excellent and a high degree of accuracy may be obtained. Furthermore, since the system is vertical, assembling the mask support in the radiation-sensitive material into the system can be done simply. No bad effects from gravity result. In order to make it possible to adjust the magnification factor and the focus independently, in the example shown in FIG. 10, the magnification factor is fixed at unity. Thus, no change in the magnification factor occurs due to an adjustment of the focus plane. Moreover, the apparatus is arranged so that no adjustment of the focus plane is necessary even if the magnification factor is changed.

In FIGS. 8, 9, and 10, a mask support 1 supports the mask PM. Lens supporting means 2 are integral with the imaging lens P. A focus adjusting ring RF is rotatably mounted on the main body for adjusting the position of the lens supporting means 2. A helicoid 3 between the mask support 1 and the lens support 2 adjusts the vertical position of the mask PM by rotating a magnification factor adjusting ring RV. This results in independent adjustment of the magnification factor while the lens P and the mask PM are integrally moved up and down by the helicoid 3 to adjust the focus. Knobs $W_\theta$, $W_y$ and $W_x$ on the precision adjusting mechanism adjust the radiation-sensitive material of the wafer W in a rotational direction $\theta$, in a direction y and a direction x respectively. Precision adjusting knobs $M_\theta$, $M_y$ and $M_x$ in the precision adjustment mechanism adjust the projection mask or photo-mask PM in a rotational direction $\theta$, in a y direction and and x direction. Knobs $A_y$ and $A_z$ adjust the optical system AS for alignment detection in a direction y and a direction z respectively.

When members $BS_1$, $BS_2$, $BS_{2'}$, $AS_1$, $AS_1'$ are removed from the light path mechanism SM simultaneously removes filter S from the path. An exposure time-setting device $T_s$ sets the exposure time. A turntable $T_t$ carries three stages for the wafers W of radiation-sensitive material. When a wafer W of radiation-sensitive material on the turntable $T_t$ is moved to a position under the optical system corresponding to the mask projection, the position of the radiation-sensitive material wafer W during the projection masking is adjusted by fluid-type positioning means to precisely locate the radiation-sensitive wafer W. Similar fluid positioning means precisely locate the mask within the system.

FIGS. 11, 11a, and 11b relate to the positioning means for either the radiation-sensitive material or the mask. FIG. 11 illustrates a wafer positioning apparatus which is easy to operate in a short period of time, avoids deviation of the mask or radiation-sensitive wafer due to shear or direct contact, and prevent errors due to differences in operators. This is done with notches in the wafers of radiation-sensitive material. The notches engage pins extending at right angles to the wafers and allow the wafers to be positioned precisely.

In FIG. 11, V-shaped notches 102a and 102b are formed at both sides of the exterior circumference of the wafer W to be positioned. Reference pins 104a and 104b extending from a wafer support 103 engage the notches 102a and 102b respectively. The pin 104a is fixed on the wafer support 103 and the other pin 104b is movable along the direction of the radius of the wafer W. The pin 104b restricts movement of the wafer in the one direction where the pin contacts the notch 102b. In this case, as the wafer W is being positioned, first the notch 102a of the wafer W engages the pin 104a, while the pin 104b is removed from the position in which it normally engages the notch 102b. Thus the pin 104b is locked into position by making the pin 104b engage the notch 102a.

FIG. 11a shows another embodiment of the positioning means. Here, right angle notches 105a and 105b on opposite sides of the wafer W each have one edge 105a' and 105b' parallel to the other. The transverse edges 105a'' and 105b'' of the notches 105a and 105b serve as stoppers which engage the reference pins 106a and 106b mounted on the wafer support 103.

The wafer is supported so that the parallel sides 105a' and 105b' of the notches 105a and 105b slide down the pins 105a and 105b respectively. The wafer W is supported in position the edges 105a' and 105b' of the notches 105a and 105b engaging the pins 106a and 106b.

FIG. 11b illustrates still another example of wafer positioning means embodying features of the invention. Here a flat edge OF is provided at the exterior circumference of the wafer W. Two separate reference pins 9a and 9b contacting the edge OF are mounted on the wafer support C and another reference pin 9 is also mounted on the wafer support C. The pin 9 contacts the wafer W at an edge other than the flat edge. In this example, the flat edge OF of the wafer W is placed in contact with the reference pin 9a and 9b when the wafer W is pushed in a direction Q by the positioning means shown in FIG. 13. In this example, precision positioning is easily available as the wafer W is restricted by three pins.

Figure 12A:
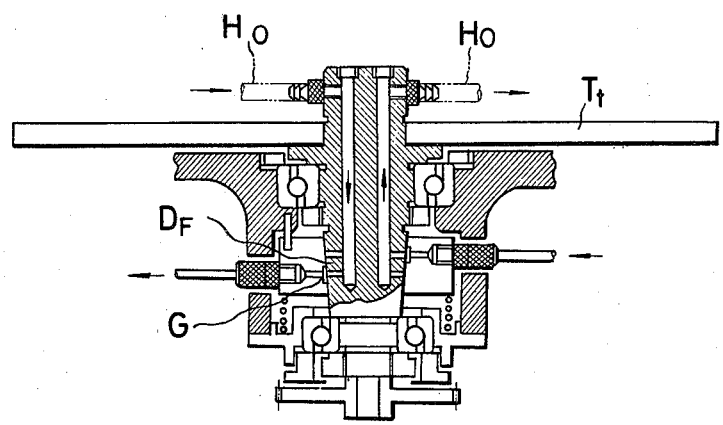
FIG. 12A is a cross-sectional view of a portion of FIG. 12.

In FIG. 12 and FIG. 12a, a turntable $T_t$ rotates around a shaft. Each of three wafers W is supported by respective wafer supporting means C. Each of the latter rests on a stage SF. Each corresponds functionally to that shown in FIG. 11b and includes precision positioning means activated by fluid as shown in detail in FIG. 13. The turntable $T_t$ moves the supporting means from a position $ST_1$ to a position $ST_2$ and then to a position $ST_3$. In the position $ST_1$ the wafer W is loaded on the supporting means C. In the position $ST_2$ the wafer is exposed, and in the position $ST_3$ the wafer is unloaded.

A fluid distributor DF is selectively gated to supply fluid to each of the supporting means C through a respective pipe HO-1, HO-2, and HO-3 on the basis of the position of the turntable $T_t$. Suitable signals operate three gates G within the fluid distributing device DF to determine which of the pipes HO-1, HO-2, HO-3 will be carrying fluid. The pipes HO-1, HO-2, and HO-3 are connected, respectively, to the three gates at one end and to the positioning means including the wafer support C at the other ends. Rotating the turntable $T_t$ causes each of the gates of the fluid distributor DF to be switched on the basis of the signal. Presetting pins 8, 8a, and 8b preset the wafer as described in detail with respect to FIG. 13.

Figure 13:
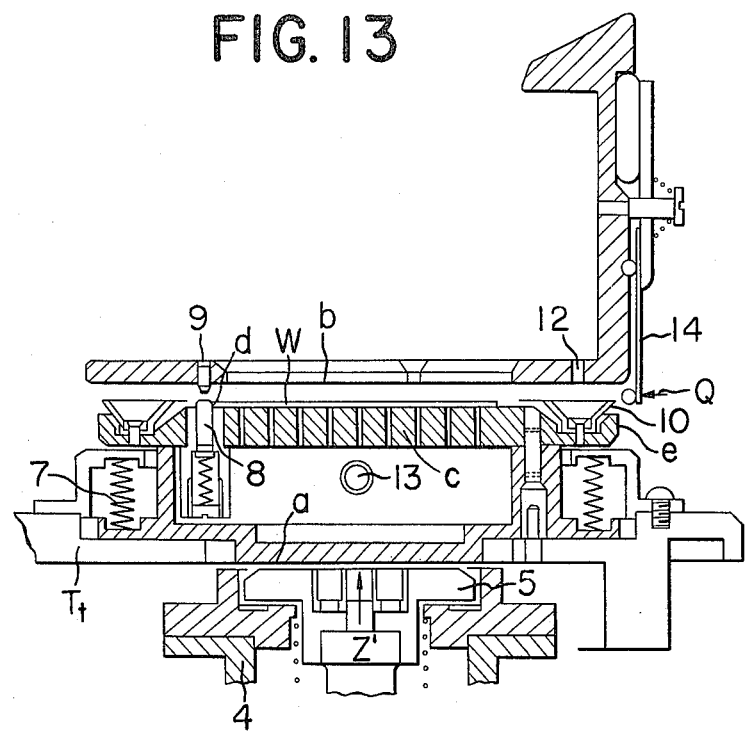
FIG. 13 is a cross-sectional view of a positioning means for radiation-sensitive material suitable for use in the apparatus of FIG. 1 and used in the apparatus of FIG. 8.

FIG. 13 is a sectional view illustrating details of the precision positioning means for the wafer W. In FIG. 13, the positioning means C is in the form of a wafer chuck. A cylinder 4 encloses a piston head 5. A vacuum suction inlet 12 is provided at the wafer disk. A vacuum suction inlet 13 is provided at the wafer disk chuck C. The inlet 13 is connected to one of the flexible pipes HO-1, HO-2, and HO-3.

In operation the wafer W is placed on the chuck forming the supporting means C at the position ST-1 to contact the wafer presetting pins 8, 8a, and 8b. After stepwise rotation of the table $T_t$ which is activated by a starting switch B-1 as shown in FIG. 8, the wafer is sucked toward the chuck positioning means C by a vacuum. Piston head 5 of the air cylinder 4 ascends automatically in the direction of Z' into contact with the bottom surface a of the chuck positioning means C so as to push up the chuck. The piston head 5 is stopped at a position at which the clearance between the upper surface of the wafer W and the lower surface b of the wafer disk 11 is 0.3 to 0.5mm.

During the ascending process mentioned above, the wafer presetting pin 8, 8a and 8b (shown in FIG. 12) are pushed down by the wafer positioning pins 9, 9a, and 9b, and the suction rubber ring 10 engages the bottom surface b of the wafer disk 11. When the piston is stopped, air is drawn out of the suction rubber ring and the upper surface of the wafer and the bottom surface b of the wafer disk 11 contact each other. At the same time a lever 14, activated by air, pushes the circumferential surface e of the chuck in the direction of the arrow Q. The side surface d of the wafer contacts the bellies of the wafer positioning pins 9, 9a, and 9b. This positions the wafer.

In this position, after observation and adjustment, exposure is completed. At this point, the vacuum at the wafer chuck and the wafer disk 11 is ended and the chuck is returned to its original position by the power of the coil springs 7. The turntable $T_t$ is rotated to the unloading stage.

Because the positioning means forces the wafer W to adhere to the surface of the chuck whose flatness is reliable, it is possible to adjust the flat surface of the wafer W. No excessive weight from the wafer is imposed on the flat surface of the chuck. Thus the surface of the chuck effectively functions as the reference surface. Suction forces the chuck against the surface of the wafer disk 11. The wafer disk thus bears only a downward load caused by the force of gravity upon the wafer and the wafer chuck. Therefore, there is no vertical deviation of the wafer disk surface $b$ due to slack in the precision positioning mechanism. Furthermore, the wafer surface always closely adheres to the wafer disk surface $b$, that is onto the image plane, even if the upper and lower surfaces of the wafer are not parallel to each other. Thus a high degree of accuracy is obtained.

Figure 14:
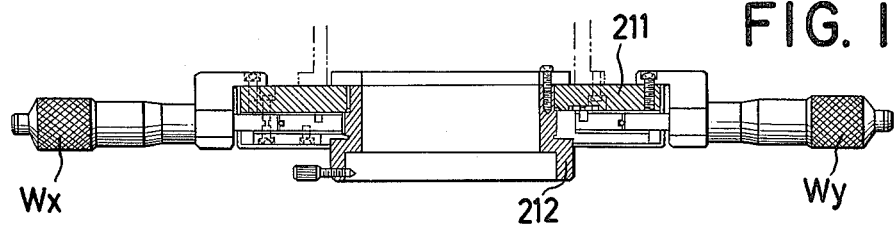
FIG. 14 and FIG. 14a are plan and elevation views, respectively, of the main portion of a precision adjustment mechanism for either the mask support or the radiation-sensitive material support.
Figure 14A:
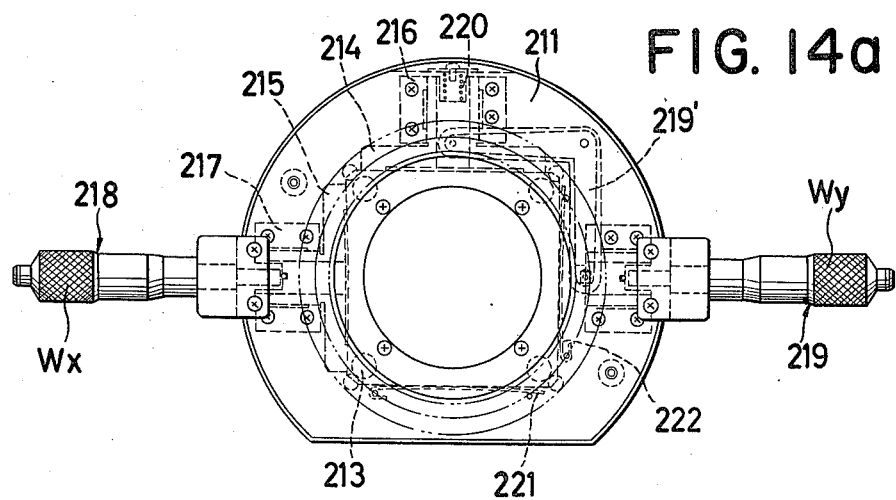
Figure 15:
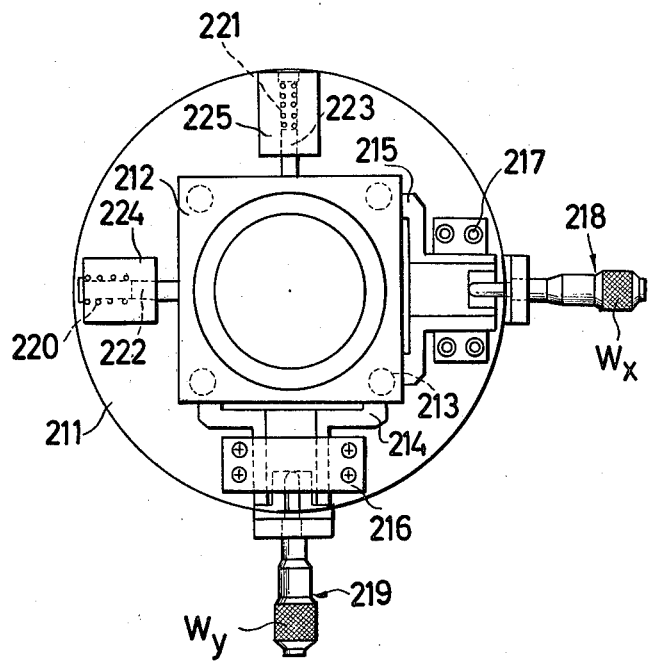
Figure 15A:
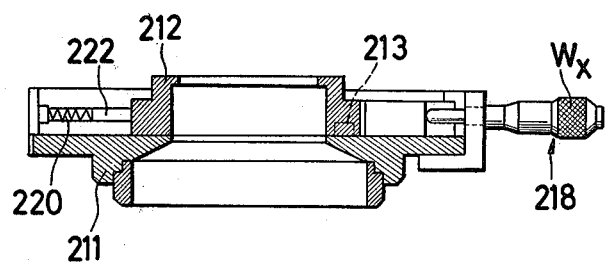

FIG. 14 shows the main portion of the precision positioning mechanism and FIG. 14a shows a cross-sectional view of the same. FIG. 15 and FIG. 15a show modified embodiments of the precision positioning mechanism. Here a movable table 212 slidably contacts a base 211. A magnet 213 is inserted in either the base 211 or the movable table 212 at their contact-sliding surface. The movable table 212 is retained in close contact with the base 211. At the same time feed guide members 214 and 215 guide the movable table 212 in the $x$-and $y$-directions. Elastic members 220 and 221 bias the movable table 212 toward the guide members 214 and 215, which is made to move in the vertical direction to the contact-sliding surface.

In the first example as shown in FIG. 14 and FIG. 14a, the movable table 212 is slidably placed on the upper surface of the base 211. The magnet 213 is buried in the sliding surface of the movable table 212 so that the table 212 is retained in close contact with said base 211. The guide members 214 and 215 have sliding surface right angled to each other. They contact and slide on the adjoining two sides of the movable table 212. Members 216, 217 movably guide the guide members 214, 215. Micro meter heads 218, 219 feed the table 212 in respective $x$- and $y$-directions to the members 214 and 215. Spring-biased pins 222 and 223 are provided at sides opposite to the sides to which said micrometer heads 218 and 219 are attached for restricting the movement of the table 212, to which power is afforded through the springs 220 and 221, to the side of said micro meter heads 218 and 219.

Guides 224 and 225 slidably guide the above-mentioned spring-biased pins 222 and 223. Knobs WX and WY serve for precision positioning as explained before.

FIG. 15 and FIG. 15a show a modified example substantially the same as the example shown in FIG. 14, FIG. 14a, and the components shown by same parts number represent parts performing similar functions as shown in FIG. 14, FIG. 14a. The difference between the two examples is that the positions of the micrometer heads 218, 219 are on a straight line in the former example, while they are in a right-angle crossing relationship in the latter example, and that the springs 220 and 221 are in a form of leaf spring in the former example, while they are in a form of coil springs in the latter example. An intermediate member 219' is required only in the former example.

The precision positioning mechanism is constructed as explained above. Operation of the control knob Wx of the micrometer head 218 feeds the table 212 in the $x$-direction. The guide member 215 advances, and the movable table 212 is pushed against the spring-biased pin 222. Thus, the movable table 212 performs a precise sliding movement while being held between the guide member 214 and the spring biased pin 223. The guide member 214 prevents movement in the $y$-direction.

On the other hand, operation of the control knob Wy of micrometer head 219 feeds the table 212 in the $y$-direction. The Guide member 214 advances and the movable table 212 is pushed against the spring-biased pin 223. Thus the movable table 212 slides precisely between the guide member 215 and the spring-biased pin 222. Guide member 215 prevents movement in $x$-direction.

As explained above, the proper functions of the system are effectively achieved by rotating the micrometer head W$\theta$ (FIG. 10). The magnet 213 holds the movable table 212 and the base 211 in a close contact. Thus, the flatness of the material such as a wafer or a mask placed on the table 212 can be guaranteed simply by assuring a parallel relationship between the movable table 212 and the base 211.

Accuracy of the right angle between the sliding surfaces of each guide member for the movable table 212 is strictly controlled. Thus, the accuracy of right angle for feeding the table in the $x$- and $y$-directions is also exactly controlled. This produces a precision positioning mechanism having a high degree of reliability.

FIG. 16 shows another example of the projection masking system according to the present invention. In FIG. 16, an illuminating optical system L serves both for projection masking and for alignment detection. The system is composed of a 500 watt super-high pressure mercury lamp $L_1$. a mirrored condenser $L_2$ and first condensing optical system $L_3$. This very first lens group $L_{31}$ in the first condensing optical system $L_3$ is made of quartz. Since it has excellent heat-resistance and hence can be positioned close to the illuminating source $L_1$, it can be made comparatively small. It is thus easy and convenient to fabricate. A filter L32 serves as a heat shield. A reflective mirror M reflects light to a second condensing optical system L'. A sharp cut filter F, placed inside the second system L', satisfactorily transmits both $g$-line and $e$-line out of light beams from the mercury lamp $L_1$. Filter L42 is suited for the sharp cutoff.

The filter F is positioned far from the light source $L_1$ in order to reduce the effect of temperature, etc. on the distribution of transmission factor. Since the filter F is held in a horizontal position, it will not be adversely affected by convection. Equalizer IE equalizes distribution of the illuminating beam. It is composed of an ND filter $IE_1$ having flat and convex surfaces and a transparent body $IE_2$ having concave and flat surfaces. A sharp cut filter S serves as a switching means and functions to transmit $e$-lines for alignment detection but cuts out $g$-lines for projection masking. Filter Y52 is suited for the filter S.

A projection Lens P has a focal distance of 170mm and an F number of 1.8. Such a lens is disclosed in Japanese Pat. application No. 68240 of 1968. The photo-mask PM is provided at the object plane. The object plane and the imaging plane in this case may be set for $g$-lines as the illuminating beam for projection masking. This is because the wafer is sensitive to $g$-lines. When the sharp cutoff filter S is incorporated as a switching means into the optical path, the beam splitting means $BS_2$ and the compensating means $BS_1$ are brought into the the optical path in a cooperative relationship, thus forming an alignment detection optical system. Positioning of the wafer may be performed by utilizing a beam which is reflected outside of the main optical path from $BS_2$. At the same time it is possible to measure the amount of exposure to the wafer and to have the results of such a measurement memorized for controlling the exposure time at the time of projection printing by utilizing the beam which is reflected outside of the main optical path from $BS_1$. In that case, if the filter S which functions as shutter is made small, it can conveniently be inserted from outside of the optical path into the optical path. While it is convenient to have the switching means S brought into the optical path in cooperation with movement of means $BS_1$ and $BS_2$ when they are brought into the optical path, only the switching means S which is moved outside of the optical path is brought into the optical path by an electromagnet, or the like, etc. for exposure control without any associated relationship with $BS_1$, $BS_2$, when $BS_1$ and $BS_2$ are evacuated outside of the optical path.

Because the filter S is positioned close to the first imaging point of the source $L_1$ of the illuminating beam and the source $L_1$ of the illuminating beam is considered as a point light source, the size of the filter S is made small. Because IP is a point at a position in a conjugate relationship with the second condensing optical system L' of the photo mask PM, and is located between the beam source $L_1$ and the filter S, it is convenient to equalize intensity of the illuminating beam from the illuminating source.

The means $BS_1$ and $BS_2$ generally cause deviation of the imaging plane to a far position. At the time of illumination for alignment detection, it is possible to structure the system so that the imaging plane at the time of illumination for projection masking does deviate from the plane for alignment detection when the wave length of the illuminating beam is changed, if the position of alignment detection marks are determined and if the aberration compensation of the imaging optical system P is made optimum for each wave length of beams used.

FIG. 17 shows a modification of the illumination equalizer used in the present invention. When the illumination distribution of the system without the illumination equalizer is measured to determine the absorbing power required for the illumination equalizer to equalize the illumination distribution of the system with the equalizer, it is understood that the required equalizer should have a higher absorbing power near the optical axis, but should have a lower absorbing power around the peripheral portion of the mask.

Equalizer IE in FIG. 16 is useful for the above purpose. Similar effects of equalizer IE in FIG. 17 are obtained by rotating IE substantially around the optical axis at a constant rate. The equalizer IE is composed of a thin glass plate $IE_g$ coated, for example, with an ND filter $IE_f$ of a compound leaf shape symmetrical to the axis.

The illumination distribution of the system should not deviate more than 5%, preferably more than 2.5%. Excessive deviation lowers the resolving power of the system. The present invention permits illumination equalizing as well as full use of the illumination intensity of the image plane.

Figure 18:
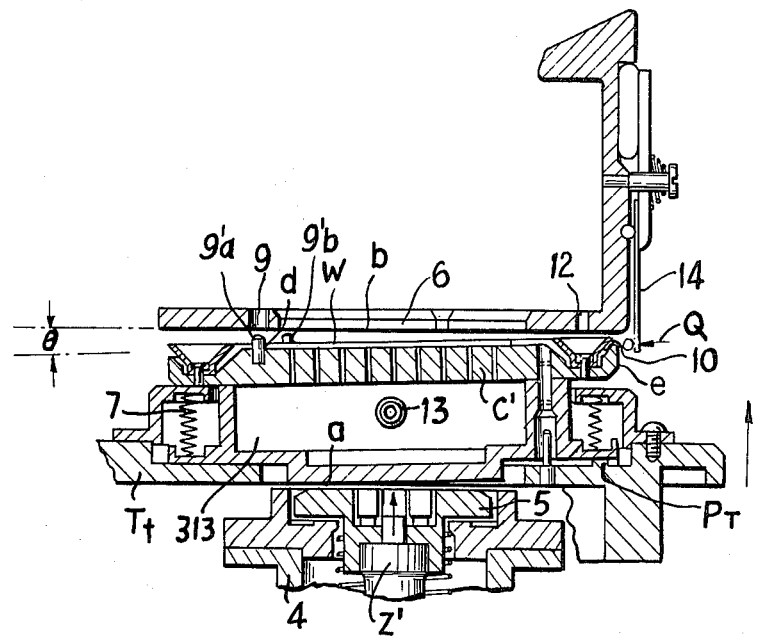
FIG. 18 is a sectional view of another precision-positioning means similar to the one shown in FIG. 13 and representing a modification thereof.
Figure 20:
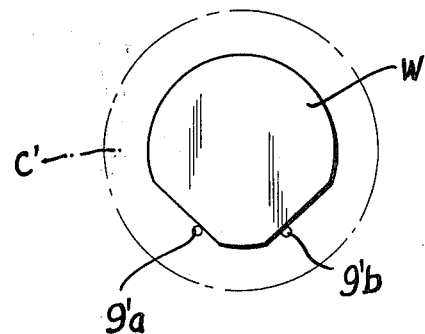
FIG. 20 is a schematic diagram illustrating an upper surface view of the wafer chuck in the means shown in FIG. 19.

FIG. 18 shows another modification of the positioning means shown in FIG. 13, in which a wafer chuck C' is inclined at an angle of $\theta$ to the lower surface of the wafer disk, and positioning pins $9'a$ and $9'b$ are mounted on the end section of wafer chuck C' as shown in FIG. 20. Namely, wafer chuck C' is held on turnable $T_t$ so its one side is lifted up by means of a pin $P_T$ projected from the turntable $T_t$. As a result, wafer chuck C' is held at an inclination angle of $\theta$ to wafer disk 6 arranged in parallel with $T_t$.

Figure 19:
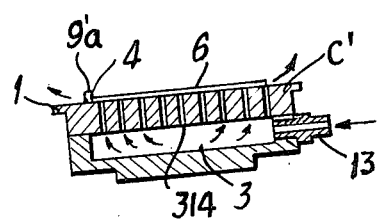
FIG. 19 is a diagram illustrating the operating principle of the means shown in FIG. 18.

In such a construction, for convenience of understanding, FIG. 19 shows a chuck carrying wafer w which is different from that shown in FIG. 18. Here air or $N_2$ gas is allowed to blow into a chamber 3 from a gas inlet pipe 13 provided at the side of the chuck and said gas is directed upwardly from tiny jets 314 provided on the surface of chuck C'. At the same time, the gas causes the wafer w placed on chuck C' to float slightly. The wafer w then moves along the inclined plane of chuck C' until it strikes pins $9'a$, $9'b$ and stops. In the next place, when the gas is drawn from inlet 13 to reduce the pressure of tiny jets 314, wafer w takes up the position determined by means of positioning pins $9'a$, $9'b$ on the surface of chuck C' and is held firmly due to the reduced pressure. Therefore, unlike the example mentioned before, it is not necessary to move the chuck itself in the horizontal direction. Piston head 5 is then lifted to prepare the next exposure operation in the same manner as in the example of FIG. 13.

According to the example mentioned above, the positioning of wafer w may be done merely by the ejection and suction of gas so that the construction of the chuck is advantageously simplified.

If the beam splitter $BS_2$ is used without the compensating beam splitter $BS_1$, then the angular orientation of the beam splitter $BS_2$ has a tendency to shift a ray of light transverse to the direction of that ray while maintaining the direction of propagation. That is to say, as a ray of light, such as a ray advancing along the center line shown in FIG. 1, enters the beam splitter it is angularly refracted toward the left throughout the thickness of the beam splitter. When it emerges from the beam splitter it is again refracted so that its path is parallel to the center line shown in FIG. 1. However, its path no longer coincides with the center line but is shifted to the left and proceeds parallel to the center line. The compensating beam splitter $BS_1$ shifts the ray to the right to compensate for the subsequent shift to the left. The two beam splitters may have a tendency to shift the plane upon which the beam focuses by effectively lengthening the distance between the mirror M and the wafer W. However, this slight defocusing in the direction along the beam has substantially no effect upon alignment in a direction transverse to the beam.

The beam splitters $BS_1$ and $BS_2$, as well as $BS_2'$ are rectangular according to one embodiment of the invention and disk-shaped according to another embodiment of the invention.

The symbol $\mu$ indicates microns or one one-thousandth of a millimeter whereas the symbol w when used with respect to the lamp $L_1$ indicates electric wattage. The symbol $2\omega$ is a reference character for the angle of vision, and $\omega$ represents half of this angle of vision.

The terms g-lines and e-lines are classical terms to indicate the more prominent Fraunhofer absorption lines. Each of these rays represents a specific frequency or range of the frequencies of these lines. The terminology is used in "Prismatic and Diffraction Spectra", Memoirs by Joseph Von Fraunhofer translated and edited by J. S. Ames, PhD., published 1898 by Harper and Bros., Publishers, New York and London, at page 41 et seq. The $e$-lines represent green light having a wavelength of 546 nm which effect no chemical change on the light-sensitive material of the wafer. However, these lines coincide with the relative luminous efficiencies of human eyes, that is they are readily visible so that these ines are proper for aligning the wafer and the mask without destroying or affecting the light sensitivity. On the other hand, $g$-lines have a wavelenght of 436 $\pi$m and have high chemical energy for affecting the radiation-sensitive material of the wafer W or w.

In changing from alignment to projection masking, the wavelength should be changed from visible light alone (that is, $e$-lines) to light which includes frequencies at which the radiation-sensitive material of the wafer can be energized, namely, light which includes $g$-lines. This can be done by changing the light source. However, this requires substantial mechanical equipment or labor. According to the present invention, the $g$-lines and $e$-lines are changed by inserting or removing the filter S.

The sharp cut characteristics of the filter represent its ability to transmit only a specified frequency band while excluding others.

The notches 102$a$ and 102$b$ on the wafer in FIGS. 11, 11$a$ and 11$b$ strike pins 104$a$, 104$b$, 106$a$, 106$b$, 9$a$, 9$b$ and 9 so that it is possible to securely fix the position of the wafer. To fix the wafer in its normal position the wafer is moved and fixed by negative air pressure. Thus, the positioning prevents slippage or error. This contrast with conventional methods wherein alignment is performed by providing a slight gap between the wafer and the mask. After this, both the wafer and the mask are pressed to perform projection masking. However, when they are pressed their relative lateral positions are likely to slip. This slippage may vary from operator to operator.

The illumination equalizer IE in FIG. 16 is a combination of $IE_2$ made of normal transparent glass and $IE_1$ having a neutral density. It has a circular form. The member $IE_1$ is thickest in the center and becomes thinner toward the circumference. Thus, transmittance decreases as the distance from the center decreases. If the equalizer IE is not used, the amount of light in the circumferential portion is less than that of the central portion and the circumferential part of the projected image is less bright than the central part. However, when the equalizer IE of the type described is used, the amount of light in the central portion decreases so that there is substantially no difference in the amount of light in the circumferential portion and the central portion. This produces a uniform brightness in the projected image.

FIG. 17 shows another practical example wherein a neutral density film $IE_f$ is placed on a circular glass base $IE_q$. By rotating the base a uniformly intense can be obtained in both the central and circumferential portions.

The beam splitting means and compensating means are positioned in front of an objective lens of the microscope and fastened with hardware which is installed integrally with a barrel of the objective lens. Semitransparent thin film is supported by a frame. During alignment, both the beam splitter means and the compensating means are located in the projection beam flux. But when the alignment is completed the microscope is moved away. At the same time the beam splitting means and the compensating means are removed out of the beam path. The movement of the microscope out of the beam path is electrically detected and causes movement of the filter S out of the path. Thus, when performing alignment, the filter is inserted into the light path, and when alignment is finished and the microscope moved, the filter is moved also.

The members $H_1$, $H_{11}$ and $H_{12}$ perform the same function as the beam splitter $BS_1$.

While embodiments of the invention have been described in detail it will be obvious to those skilled in the art that the invention may be embodied otherwise without departing from the spirit and scope.

We claim:

1. A projection masking system adapted to use with a mask and radiation-sensitive component for transferring a mask image onto said component, comprising illuminating means forming an optical path, said optical path having an axis, imaging means in the optical path along the axis of the path, said imaging means including a mask support for supporting a mask and imaging lens means as well as a radiation-sensitive-component support all in the optical path, said imaging lens means focuses an image of a mask on the mask support onto a component on the component support, said illuminating means including switching means movable into and out of the optical path for excluding radiation to which a radiation-sensitive component is sensitive and to render the illuminating means usable for alignment detection when the switching means is in the path, analyzer means including half-mirror means in the light path between said imaging means and said radiation-sensitive component support for allowing light to strike a component and to reflect light out of the optical path and into a detecting path, said analyzer means analyzing the relationship between the image and a component, portions of said analyzer means in said light path being movable from the light path, said half-mirror means producing a radial shift of the image relative to the axis, said analyzer means including compensating means in the light path for compensating for the radial shift by said half-mirror means.

2. A system as in claim 1, wherein the path through the imaging means follows a direction vertical to the surface of the earth.

3. A system as in claim 1, wherein said radiation sensitive component support includes fluid actuated positioning means for positioning said radiation-sensitive component.

4. A system as in claim 3, wherein said positioning means includes a component holder having a surface which inclines at a predetermined angle relative to a plane transverse to the axis, said holder forming a plurality of jets, gas inlet means communicating with said jets for producing a discharge through the jets at the surface for reducing the frictional resistance between the component and the surface so that the component may be moved over the surface while riding on a fluid bed.

5. A system as in claim 1, wherein said illuminating means includes an illumination equalizer.

6. A system as in claim 1, further comprising switching mechanism means for simultaneously moving said switching means and said analyzer means in and out of the path.

7. A system as in claim 6, wherein said radiation-sensitive component support includes fluid actuated positioning means for positioning said radiation-sensitive component.

8. A system as in claim 7, wherein said half-mirror means and said compensating means each have a thickness in a range up to 25 microns.

9. A system as in claim 8, wherein said analyzer means includes a binocular alignment microscope having a field splitter with a triangular cross-section and being located in the path of light reflected by said half-mirror means, said field splitter forming a splitter axis and being rotatable about the splitter axis for a total field view.

10. A system as in claim 7, wherein said half-mirror means form beam splitters.

11. A system as in claim 7, wherein said compensating means include an additional half-mirror means in the path.

12. A system as in claim 11, wherein said pair of half-mirror means in said analyzer means intersect a plane through said axis of the path at an angle, and wherein said half-mirror means in said compensating means intersects the plane through said axis of the path at an angle supplementary to the angle at which said pair of half-mirror means intersect the plane.

13. A system as in claim 12, wherein said half-mirror means all have lower surfaces and upper surfaces, and wherein the lower surfaces of said pair of half-mirror means intersect the plane at an angle equal to the supplement of the angle at which the upper surface of the half-mirror means in said compensating means intersects the plane.

14. A system as in claim 1, wherein said compensating means includes half-mirror means.

15. A system as in claim 14 wherein said half-mirror means of said compensating means and said half-mirror means of said analyzer means intersect the axes at supplementary angles.

16. A projection masking system, comprising illuminating means for furnishing light along a path suitable for projection masking as well as alignment detection, imaging means along the path for forming an image of a mask member, said imaging means including a mask support for supporting a mask member and imaging lens means for forming an image of the mask member as well as a radiation-sensitive-component support for supporting a component at the image, the path having an axis, analyzer means having a pair of half-mirror means in the path on opposite sides of the axis for passing a portion of light in the path toward a component on said component support and being positioned to deflect light out of the path, said analyzer means detecting the position of the image relative to said component, said half-mirror means producing a shift of the image radially relative to the axis, said analyzer means including compensating means for compensating for the shift, and means for removing said analyzer means from the path.

17. A system as in claim 16, wherein said analyzer means includes a binocular alignment microscope having a field splitter with a triangular cross-section and being located in the path of light deflected by said half-mirror means, said field splitter forming a splitter axis and being rotatable about the splitter axis for a total field view.

* * * * *